United States Patent
Yu et al.

(10) Patent No.: US 11,854,986 B2
(45) Date of Patent: Dec. 26, 2023

(54) CHAMFERED DIE OF SEMICONDUCTOR PACKAGE AND METHOD FOR FORMING THE SAME

(71) Applicant: Taiwan Semiconductor Manufacturing Co., Ltd., Hsinchu (TW)

(72) Inventors: Chen-Hua Yu, Hsinchu (TW); Wei-Kang Hsieh, Tainan (TW); Shih-Wei Chen, Hsinchu (TW); Tin-Hao Kuo, Hsinchu (TW); Hao-Yi Tsai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/809,961

(22) Filed: Jun. 30, 2022

(65) Prior Publication Data

US 2022/0336361 A1    Oct. 20, 2022

Related U.S. Application Data

(62) Division of application No. 16/926,215, filed on Jul. 10, 2020, now Pat. No. 11,682,626.

(60) Provisional application No. 62/967,245, filed on Jan. 29, 2020.

(51) Int. Cl.
| | |
|---|---|
| *H01L 23/40* | (2006.01) |
| *H01L 23/538* | (2006.01) |
| *H01L 23/00* | (2006.01) |
| *H01L 23/31* | (2006.01) |
| *H01L 21/768* | (2006.01) |
| *H01L 25/065* | (2023.01) |

(Continued)

(52) U.S. Cl.
CPC .......... *H01L 23/5384* (2013.01); *H01L 21/56* (2013.01); *H01L 21/76802* (2013.01); *H01L 23/31* (2013.01); *H01L 23/367* (2013.01); *H01L 23/4006* (2013.01); *H01L 23/4012* (2013.01); *H01L 23/5385* (2013.01); *H01L 24/14* (2013.01); *H01L 25/0657* (2013.01)

(58) Field of Classification Search
CPC ......... H01L 2924/163; H01L 2924/173; H01L 2924/183; H01L 2224/02135; H01L 2224/02175; H01L 2224/02245; H01L 2224/03013; H01L 2224/11013; H01L 2224/27013; H01L 23/4006; H01L 2023/4037; H01L 2023/405; H01L 2023/4087; H01L 2924/181–186; H01L 23/28; H01L 23/31–3114; H01L 23/3142; H01L 21/56–568
See application file for complete search history.

(56) References Cited

U.S. PATENT DOCUMENTS

| | | |
|---|---|---|
| 5,648,890 A | 7/1997 | Loo et al. |
| 6,049,124 A | 4/2000 | Raiser et al. |
| 8,361,842 B2 | 1/2013 | Yu et al. |

(Continued)

*Primary Examiner* — Nicholas J Tobergte
*Assistant Examiner* — William Henry Anderson
(74) *Attorney, Agent, or Firm* — Slater Matsil, LLP

(57) ABSTRACT

A semiconductor device includes a die, an encapsulant over a front-side surface of the die, a redistribution structure on the encapsulant, a thermal module coupled to the back-side surface of the die, and a bolt extending through the redistribution structure and the thermal module. The die includes a chamfered corner. The bolt is adjacent to the chamfered corner.

20 Claims, 23 Drawing Sheets

(51) Int. Cl.
    *H01L 21/56*         (2006.01)
    *H01L 23/367*      (2006.01)

(56) References Cited

U.S. PATENT DOCUMENTS

| | | |
|---|---|---|
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 9,281,254 B2 | 3/2016 | Yu et al. |
| 9,443,780 B2 | 9/2016 | Chen |
| 10,096,578 B1 | 10/2018 | Yeh et al. |
| 10,622,272 B1 * | 4/2020 | Liang ............ H01L 23/562 |
| 11,004,816 B2 | 5/2021 | Lin et al. |
| 2001/0051392 A1 | 12/2001 | Akram |
| 2008/0006900 A1 | 1/2008 | Chan et al. |
| 2010/0248451 A1 * | 9/2010 | Pirogovsky ........ B23K 26/0624 |
| | | 257/E21.599 |
| 2011/0291288 A1 | 12/2011 | Wu et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2015/0380357 A1 * | 12/2015 | Liu ............ H01L 23/544 |
| | | 257/737 |
| 2016/0336296 A1 | 11/2016 | Jeong et al. |
| 2018/0350755 A1 | 12/2018 | Huang et al. |
| 2019/0006256 A1 * | 1/2019 | Huang ............ H01L 24/81 |
| 2019/0363017 A1 * | 11/2019 | Seddon ............ H01L 21/0475 |
| 2020/0105641 A1 * | 4/2020 | Lai ............ H01L 21/568 |
| 2022/0367310 A1 | 11/2022 | Lee ............ H01L 23/36 |

* cited by examiner

CHAMFERED DIE OF SEMICONDUCTOR PACKAGE AND METHOD FOR FORMING THE SAME

PRIORITY CLAIM AND CROSS-REFERENCE

This application is a divisional of U.S. patent application Ser. No. 16/926,215, filed on Jul. 10, 2020, entitled "Chamfered Die of Semiconductor Package and Method for Forming the Same," which claims the benefit of U.S. Provisional Application No. 62/967,245, filed on Jan. 29, 2020, which applications are hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is package-on-package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
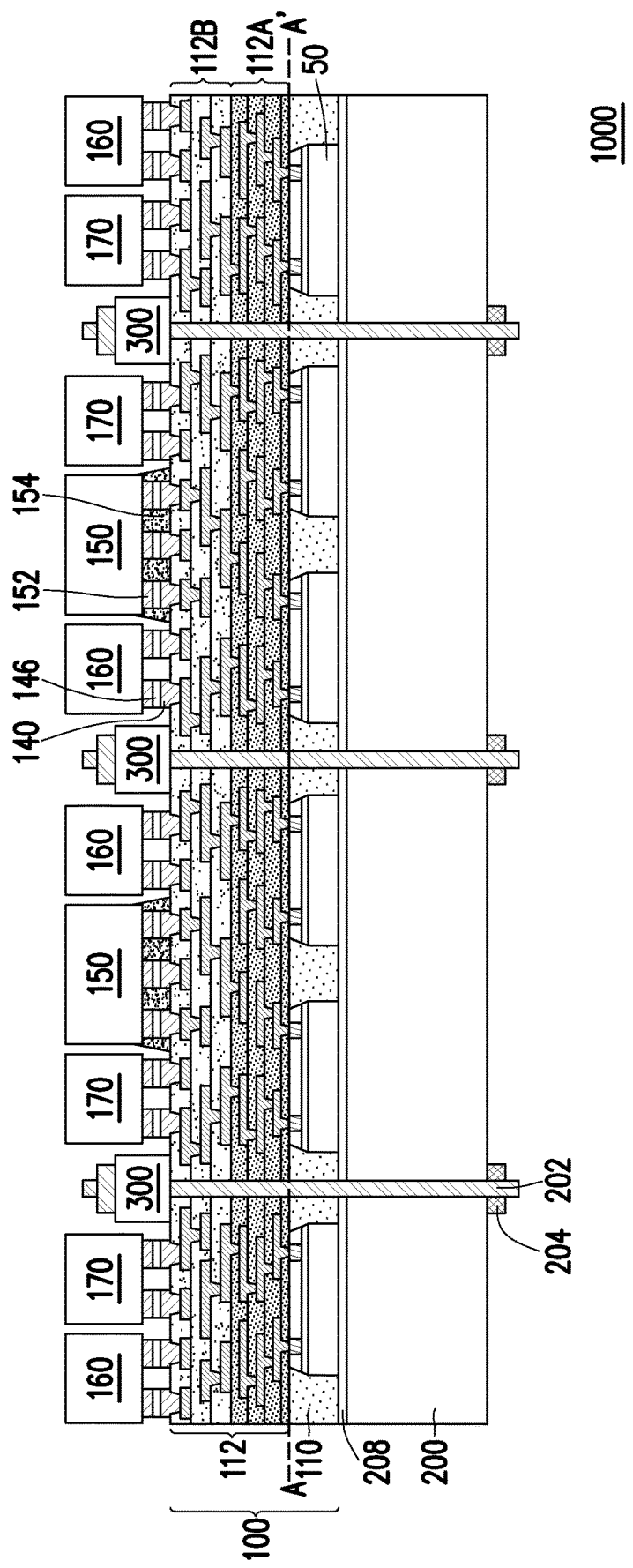
FIG. 1 illustrates a cross-sectional view of a system-on-wafer assembly, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments such as those discussed herein include a package and method of forming a package integrating a thermal module while lowering the die to die (dies are sometimes referred to as chips) spacing in the package. For example, the dies in the package can have chamfered edges or corners to achieve the denser die placement while still allowing for mechanical braces (e.g., screws) that attach the thermal modules to the package. Embodiments of the disclosure can be applied to a super-large package with an area more than 10000 mm$^2$ based on fan-out wafer-level package process. Embodiments, such as those discussed herein, may further improve electrical performance of the package. Further advantages include reducing chip to chip space by a chip chamfering process for a fine pitch substrate-interconnect, including six or more layers of redistribution layers for better routing feasibility, and enabling a chiplet design approach which separates many functions performed by a larger die into fewer functions performed by smaller dies.

FIG. 1 illustrates a cross-sectional view of a system-on-wafer 1000 including a package component 100 such as a super-large fan-out wafer-level package (FOWLP) with an area more than 10000 mm$^2$, in accordance with some embodiments. In FIG. 1, the system-on-wafer 1000 includes a package component 100, a thermal module 200, a thermal interface material (TIM) 208, and a mechanical brace 300 to achieve enhanced thermal interface material (TIM) 208 pressure in a thermal management system. The thermal module 200 and the mechanical brace 300 are secured to the package component 100 by bolts 202. Fasteners 204 attach to the bolts 202 at both sides of the system-on-wafer assembly (e.g., at the side having the thermal module 200 (sometimes referred to as the back side) and at the side having the mechanical brace 300 (sometimes referred to as the front side)). The package component 100 comprises a plurality of dies 50 on the TIM 208, an encapsulant 110 encapsulating the dies 50, a redistribution structure 112 having a fine-featured portion 112A and a coarse-featured portion 112B over the encapsulant 110 and dies 50. Edges or corners of the dies 50 are chamfered. The chamfering provides space for the bolts 202, allowing the thermal module 200 to be attached to the package component 100 while achieving denser die placement. The redistribution structure 112 includes metallization patterns, dielectric layers, and under-bump metallurgies (UBMs) 140. Conductive connectors 146 attach the UBMs 140 to components such as, e.g., additional packages 150, passive devices 160, and/or connectors 170. The additional packages 150, passive devices 160, and/or connectors 170 may include pads 152 on bottom surfaces to physically and electrically couple with the conductive connectors 152. In some embodiments, underfills 154 fill the gaps between the additional packages 150 and the redistribution structure 112.

Figure 2A:
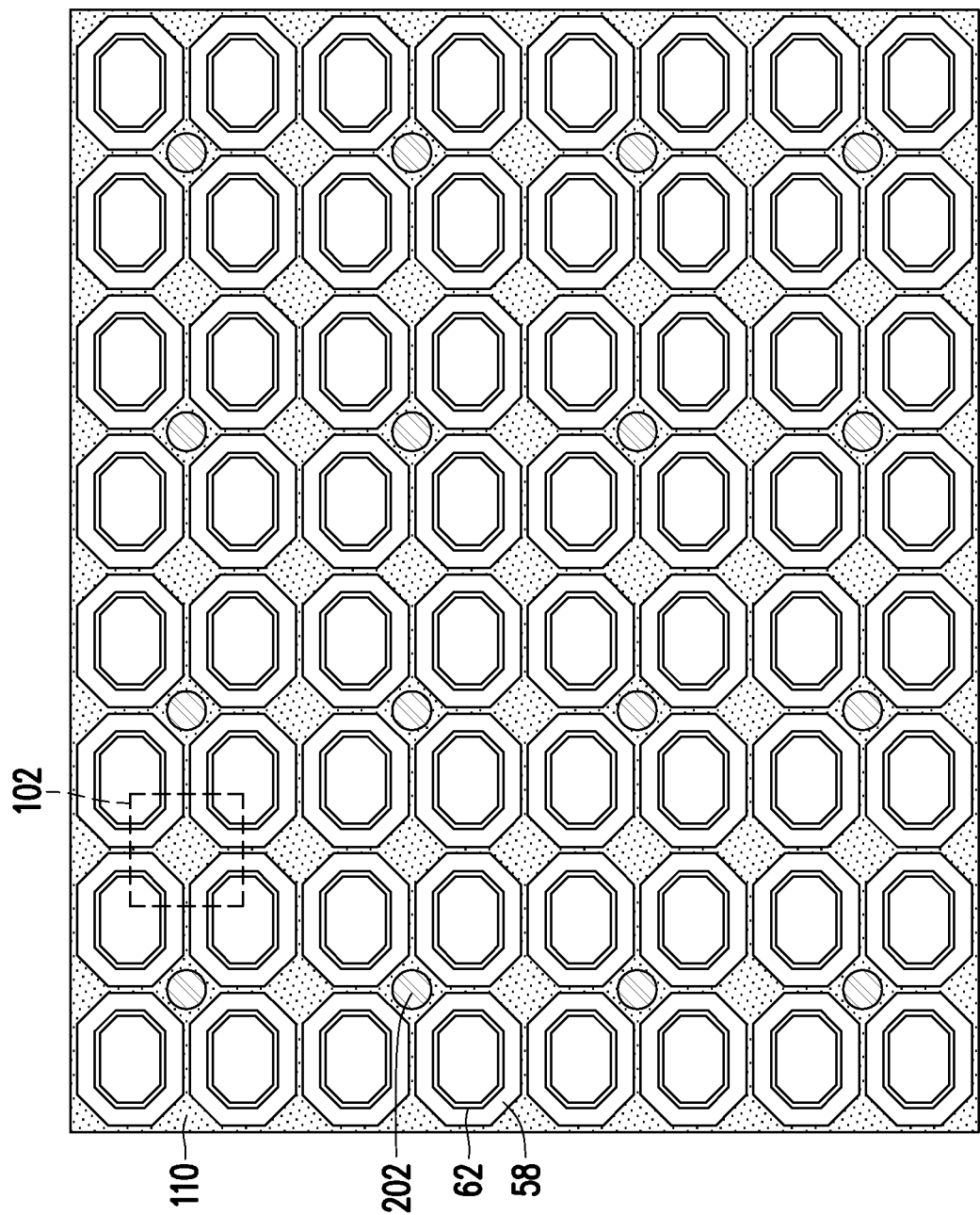
FIG. 2A illustrates a plan view of dies in a system-on-wafer assembly, in accordance with some embodiments.

FIG. 2A illustrates a plan view of the system-on-wafer 1000 along the cross-section A-A' as illustrated in FIG. 1. The plurality of dies 50 are placed to achieve denser die placement, with the chamfered corners of the dies 50 providing space to fit the bolts 202. In some embodiments, each of the dies 50 comprises respective seal rings 62 on dielectric layers 58 of each of the dies. The seal rings 62 may be dummy structures and may act as a barrier to prevent liquids or other contaminants from contacting the tops of the dies 50. In some embodiments, the seal rings 62 comprise a metal. In some embodiments, the bolts 202 are placed through every other gap between the chamfered corners of the dies 50, as shown in FIG. 2A. In some embodiments, the bolts 202 are placed through every gap between the chamfered corners of the dies 50. In some embodiments, the bolts 202 are placed through every third gap or fewer between the chamfered corners of the dies 50. In some embodiments, only the corners of the dies 50 facing the bolts 202 are chamfered.

Figure 2B:
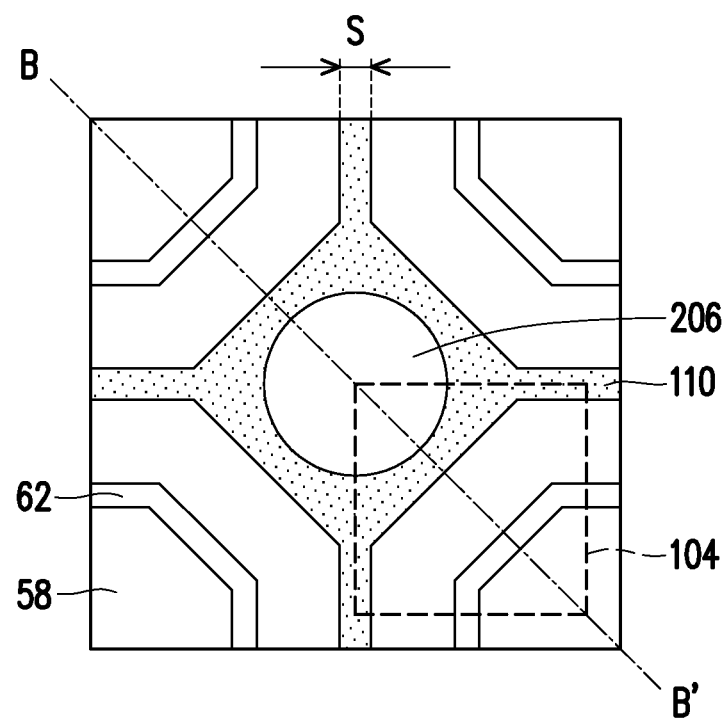
FIG. 2B illustrates a detailed plan view of a region of FIG. 2A.

FIG. 2B illustrates a detailed view of region 102 of FIG. 2A. The bolt 202 is not illustrated, showing the hole 206 between the chamfered corners of the dies 50. In some embodiments, the corners of the dies 50 are chamfered with straight edges on the tops of the dies 50. A space S between adjacent chips or dies 50 measured between opposite sidewalls of the dies 50 is in a range of about 40 µm to about 10000 µm, such as in a range of about 50 µm to about 100 µm.

Figure 3A:
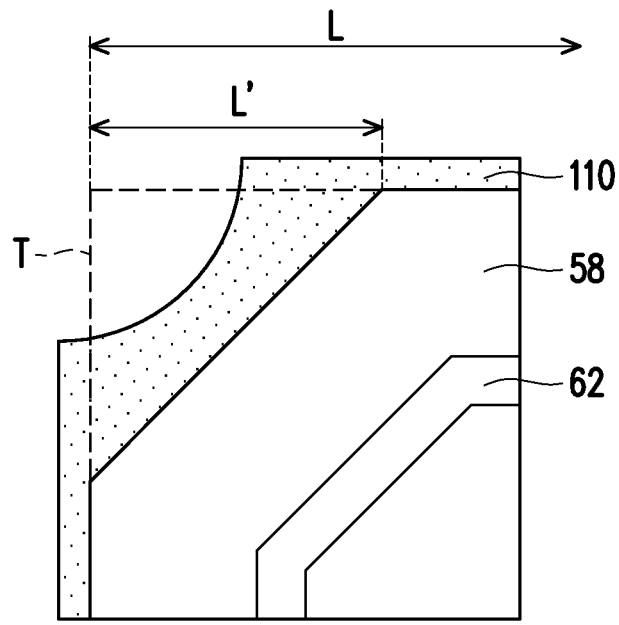
FIG. 3A illustrates a plan view of a die in a system-on-wafer assembly.

FIG. 3A illustrates a detailed view of region 104 of FIG. 2B. In some embodiments, the chamfer can include the removal of the full corner of the chip. The triangular shape T formed by the straight chamfered line with the corner of the die 50 before chamfering may be any kind of triangle, such as a right triangle, an isosceles triangle, a regular triangle, or the like. In an embodiment, the ratio of the area of the triangular shape T, measured between the outer vertex of the chamfered corner and vertices of the chamfered corner on remaining sidewalls of the chip 50, to the original total surface area measured on the top surface of the original chip 50 is in a range of about 0.01 to about 0.3. In an embodiment, the ratio of the length L' of the portion of the chip 50 removed by chamfering, measured between the outer vertex of the chamfered corner to a vertex of the chamfered corner on a remaining sidewall of the chip 50, to the length L of the chip 50 measured along one side of the chip 50 prior to chamfering is in a range of about 0.01 to about 0.3.

Figure 3B:
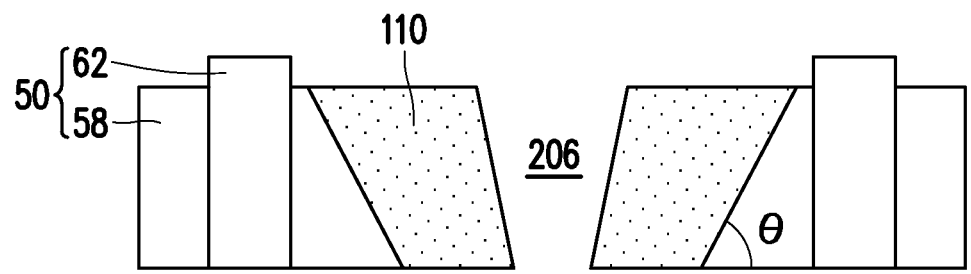
FIG. 3B illustrates a cross-sectional view of a die in a system-on-wafer assembly.

FIG. 3B illustrates a cross-sectional view along B-B' as illustrated in FIG. 2B. The hole 206 is through the encapsulant 110, which is on the chamfered faces of the dielectric layers 58 of the dies 50. In some embodiments, the angle θ between the bottom of the dies 50 and the chamfered faces of the dies 50 is in a range of about 30° to about 90°. In some embodiments, a dielectric layer 58 of a die 50 is silicon (e.g., a silicon substrate), and the chamfered face of the dielectric layer 58 is a silicon edge.

Figure 3C:
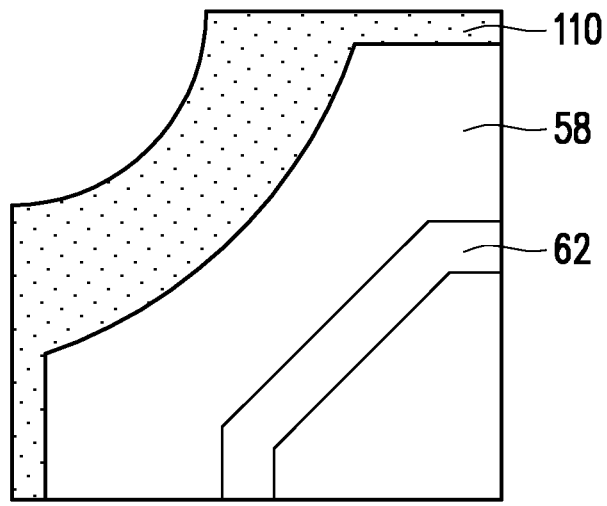
FIGS. 3C through 3E illustrate plan views of dies in a system-on-wafer assembly, in accordance with some embodiments.
Figure 3D:
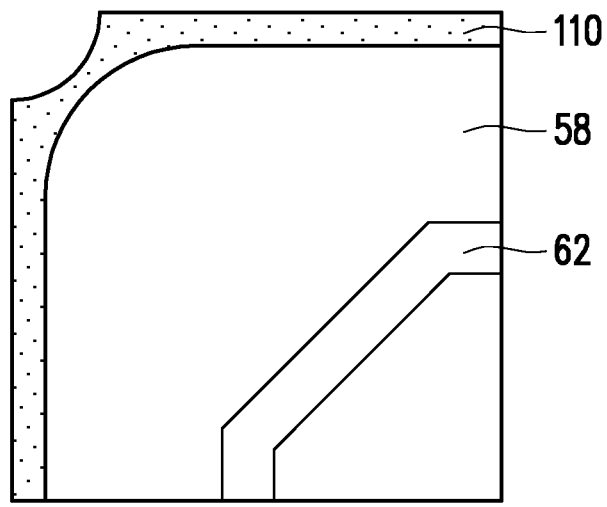
Figure 3E:
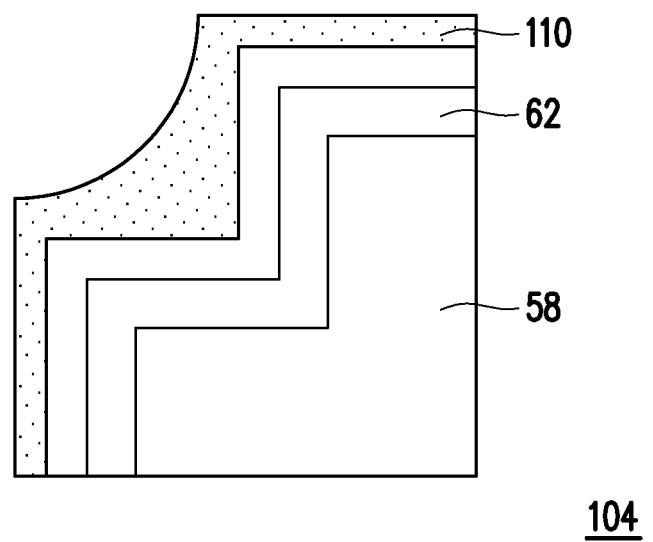

FIGS. 3C, 3D, and 3E illustrate detailed views of region 104 of FIG. 2B, in accordance with some embodiments. In some embodiments as illustrated by FIG. 3C, the corners of the dies 50 are chamfered with concave shapes. In some embodiments as illustrated by FIG. 3D, the corners of the dies 50 are chamfered with convex shapes. In some embodiments as illustrated by FIG. 3E, the corners of the dies 50 are chamfered with the full corners removed, forming inverted corners. The seal rings 62 may be formed so that the chamfering process does not cut across the seal rings 62.

FIG. 4A-22 illustrate intermediate steps during a process for forming a package, in accordance with some embodiments. FIGS. 4A-11G illustrates an exemplary process for forming a die with chamfered corners. FIGS. 12-22 illustrate an exemplary process flow for incorporating those chamfered corner dies into a fan-out package structure.

Figure 4A:
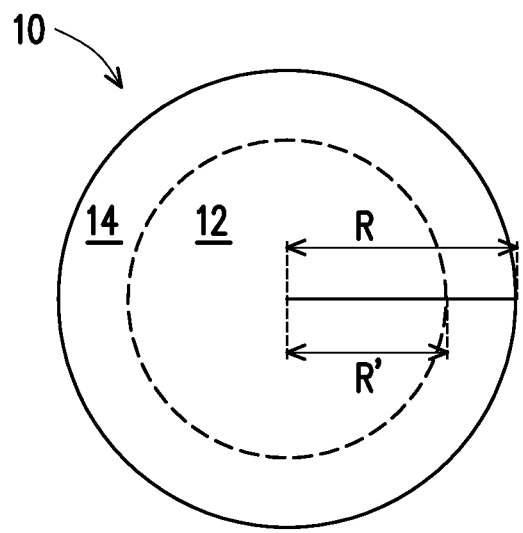
FIGS. 4A and 4B illustrate plan views of semiconductor wafers, in accordance with some embodiments.

FIG. 4A illustrates a circular wafer 10 in accordance with some embodiments. The functional portion of the circular wafer 10 that may subsequently be used to form functional dies 50 (see below, FIG. 5A), also referred to as integrated circuit (IC) dies 50, is located in a circular center zone 12. The dummy area of the circular wafer 10 that may subsequently be used to form dummy dies 60 (see below, FIG. 5B) is located in an annular peripheral area 14. In some embodiments, the radius R' of the center zone 12 covers about 67% of the radius R of the circular wafer 10, and the peripheral area 14 covers the remaining 33% of the radius R.

Figure 4B:
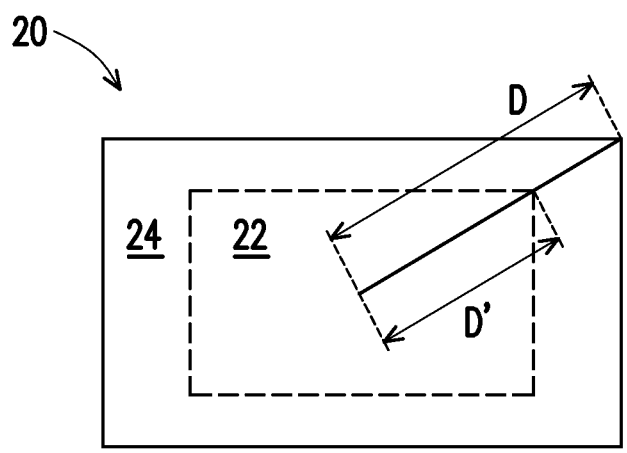

FIG. 4B illustrates a rectangular wafer 20 in accordance with some embodiments. The functional portion of the rectangular wafer 10 that may subsequently be used to form functional dies 50 (see below, FIG. 5A), also referred to as integrated circuit (IC) dies 50, is located in a rectangular center zone 22. The dummy area of the rectangular wafer 10 that may subsequently be used to form dummy dies 60 (see below, FIG. 5B) is located in a rectangular peripheral area 24. In some embodiments, the diagonal D' of the rectangular center zone 22 covers about 67% of the diagonal D of the rectangular wafer 20, and the rectangular peripheral area 24 covers the remaining 33% of the diagonal D'.

Figure 5A:
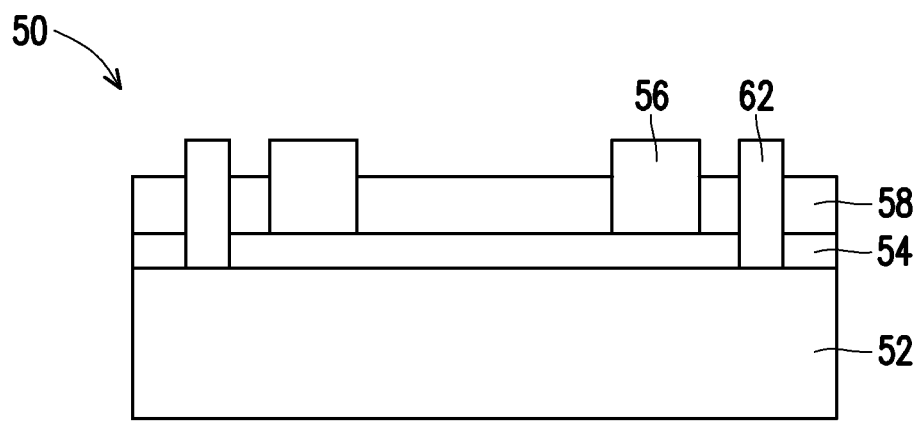
FIGS. 5A and 5B illustrate cross-sectional views of dies, in accordance with some embodiments.

FIG. 5A illustrates a cross-sectional view of a functional die or IC die 50, in accordance with some embodiments. The IC die 50 may be formed on circular center zones 12 of circular wafers 10 (see above, FIG. 4A) or on rectangular center zones 22 of rectangular wafers 20 (see above, FIG. 4B). The IC die 50 may be processed according to applicable manufacturing processes to form integrated circuits. For example, the IC die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side. Devices may be formed at the front surface of the semiconductor substrate 52. The devices may be active devices (e.g., transistors, diodes, etc.) or passive devices (e.g., capacitors, resistors, inductors, etc.).

Still referring to FIG. 5A, an interconnect structure 54 is over the semiconductor substrate 52, and interconnects the devices to form an integrated circuit. The interconnect structure 54 may be formed by, for example, metallization patterns in dielectric layers on the semiconductor substrate 52. The metallization patterns include metal lines and vias formed in one or more low-k dielectric layers. The metallization patterns of the interconnect structure 54 are electrically coupled to the devices of the semiconductor substrate 52. The IC die 50 further includes pads, such as aluminum pads, to which external connections are made. The pads are on the active side of the IC die 50, such as in and/or on the interconnect structure 54. One or more passivation films may be on the IC die 50, such as on portions of the interconnect structure 54. Die connectors die connectors 56 are physically and electrically coupled to the interconnect structure 54. The die connectors 56 may be formed by, for example, plating, or the like. The die connectors 56 electrically couple the respective integrated circuits of the IC die 50.

A seal ring 62 may also be on the semiconductor substrate 52 and in the interconnect structure 54. The seal ring 62 may be formed by, for example, metallization patterns in dielectric layers on the semiconductor substrate 52. In some embodiments, the seal ring 62 may be formed by the same processes and at the same time as the interconnect structure 54. The seal ring 62 may be a dummy structure that acts as a barrier to prevent liquids or other contaminants from reaching the active regions of the semiconductor substrate 52 during subsequent fabrication steps. Further, the seal ring 62 may protect the active regions of the semiconductor substrate 52 and may protect the interconnect 54 during subsequent singulation and may reduce or prevent the formation of defects (e.g., delamination, cracking, and the like). In some embodiments, the seal ring 62 comprises a metal. The seal ring 62 may be formed by, for example, plating, or the like.

Optionally, solder regions (e.g., solder balls or solder bumps) may be disposed on the pads of the interconnect structure 54. The solder balls may be used to perform chip probe (CP) testing on the IC die 50. CP testing may be performed on the IC die 50 to ascertain whether the IC die 50 is a known good die (KGD). Thus, only IC dies 50, which are KGDs, undergo subsequent processing and packaging, and dies, which fail the CP testing, are not packaged. After testing, the solder regions may be removed in subsequent processing steps.

Further referring to FIG. 5A, a dielectric layer 58 may (or may not) be on the active side of the IC die 50, such as on the passivation films and the die connectors 56. The dielectric layer 58 laterally encapsulates the die connectors 56, and the dielectric layer 58 is laterally coterminous with the IC die 50. Initially, the dielectric layer 58 may bury the die connectors 56, such that the topmost surface of the dielectric layer 58 is above the topmost surfaces of the die connectors 56. In some embodiments where solder regions are disposed on the die connectors 56, the dielectric layer 58 may also bury the solder regions. Alternatively, the solder regions may be removed prior to forming the dielectric layer 58. In some embodiments, the die connectors 56 may protrude above the dielectric layer 58.

Continuing to refer to FIG. 5A, the dielectric layer 58 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like, or a combination thereof. The dielectric layer 58 may be formed, for example, by spin coating, lamination, chemical vapor deposition (CVD), or the like. In some embodiments, the die connectors 56 are exposed through the dielectric layer 58 during formation of the IC die 50. In some embodiments, the die connectors 56 remain buried and are exposed during a subsequent process for packaging the IC die 50. Exposing the die connectors 56 may remove any solder regions that may be present on the die connectors 56.

Still referring to FIG. 5A, in some embodiments, the IC die 50 is a stacked device that includes multiple semiconductor substrates 52. For example, the IC die 50 may be a memory device such as a hybrid memory cube (HMC) device, a high bandwidth memory (HBM) device, or the like that includes multiple memory dies. In such embodiments, the IC die 50 includes multiple semiconductor substrates 52 interconnected by through-substrate vias (TSVs). Each of the semiconductor substrates 52 may (or may not) have an interconnect structure 54.

Figure 5B:
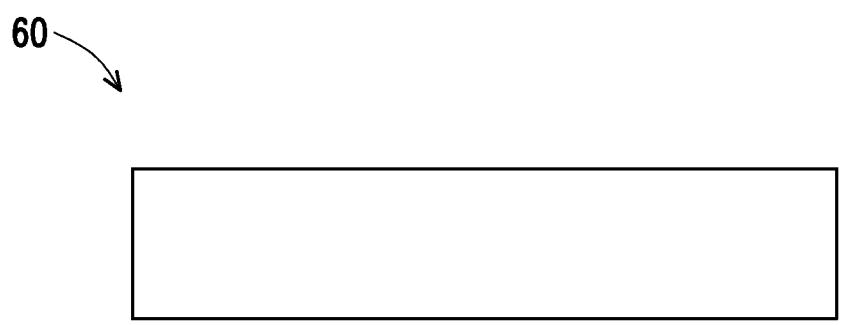

FIG. 5B illustrates a cross-sectional view of a dummy die 60, in accordance with some embodiments. The dummy die 60 may be formed on annular peripheral zones 14 of circular wafers 10 (see above, FIG. 4A) or on rectangular peripheral zones 24 of rectangular wafers 20 (see above, FIG. 4B). The dummy die 60 may comprise silicon, glass ($SiO_2$), sapphire ($Al_2O_3$), Ge, or SiGe, a combination thereof, or the like. Dummy dies 60 may be subsequently used in the assembly of a system-on-wafer 1000 for warpage control of the wafer. In some embodiments, the dummy dies 60 have non-functional interconnects formed on them substantially similar to the interconnects formed on the IC dies 50, such as e.g. the die connectors 56, which may be useful in increasing production throughput.

FIGS. 6 through 10 illustrate perspective views of intermediate stages in the formation of IC dies 50 and/or dummy dies 60 in accordance with some embodiments. The formation of IC dies 50 and/or dummy dies 60 is shown with respect to a circular wafer 10 (see above, FIG. 4A) for illustrative purposes. It should be understood that the process steps illustrated below in reference to FIGS. 6 through 10 may be applied to other wafer shapes, such as e.g. a rectangular wafer 20 (see above, FIG. 4B).

Figure 6:
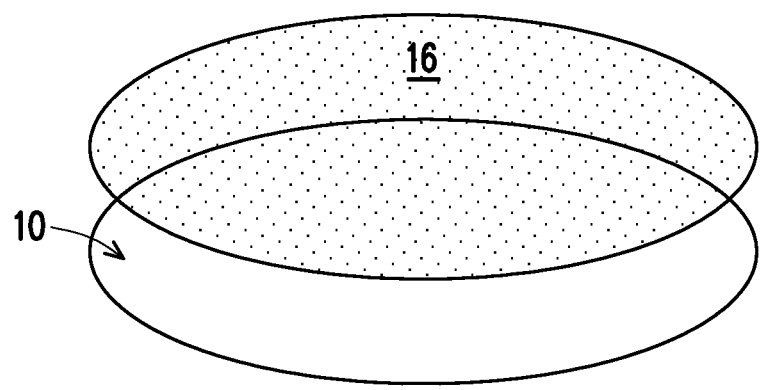
FIGS. 6 through 10 illustrate perspective views of intermediate stages in the production of dies, in accordance with some embodiments.
Figure 7:
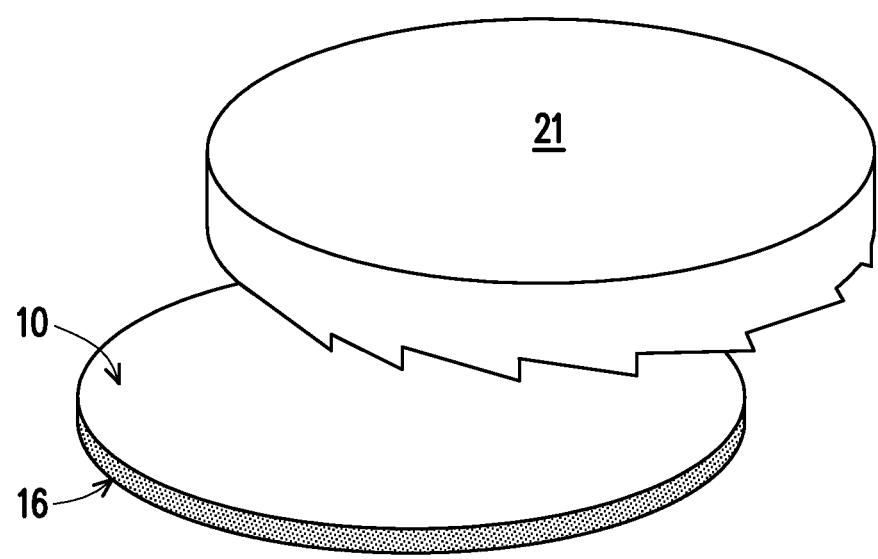
Figure 8:
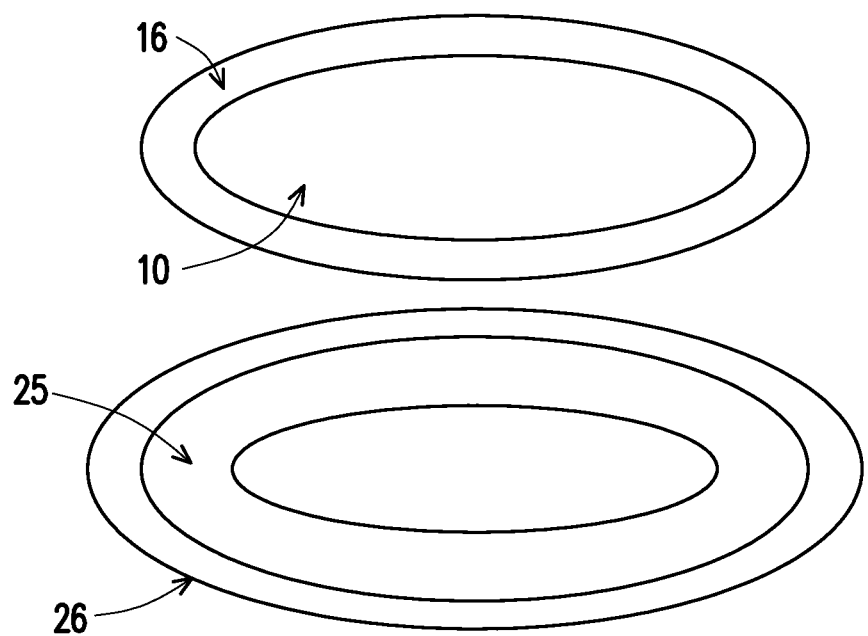
Figure 9:
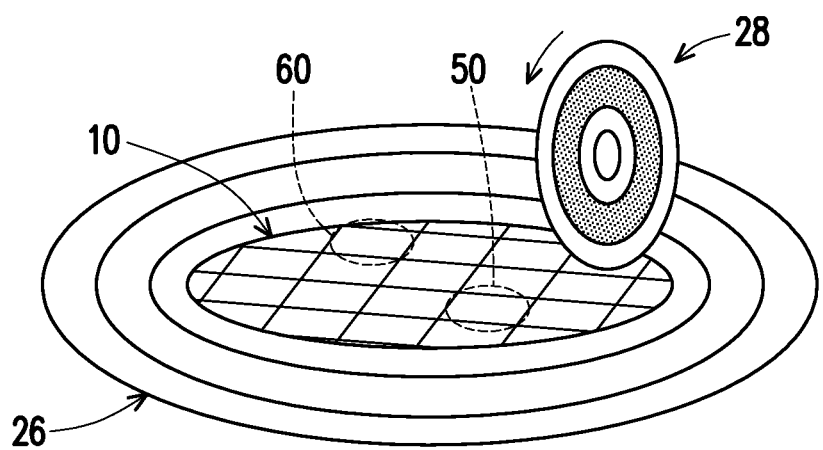

Referring to FIG. 6, circular wafer 10 is adhered to a Backside Grinding (BG) tape 16 for protecting the front surface of the circular wafer 10. Next, as shown in FIG. 7, a backside grinding is performed to thin the circular wafer 10, wherein grinder 21 is illustrated schematically. In a subsequent process, as shown in FIG. 8, a dicing tape 25 is adhered to the circular wafer 10. Dicing tape 25 and BG tape 16 are on the opposite sides of the circular wafer 10. Frame 26 is used for supporting dicing tape 25. The BG tape 16 is then removed. Next, as shown in FIG. 9, the circular wafer 10 is sawed (singulated) apart into a plurality of IC dies 50 and/or a plurality of dummy dies 60 using, e.g., a dicing blade 28.

Figure 10:
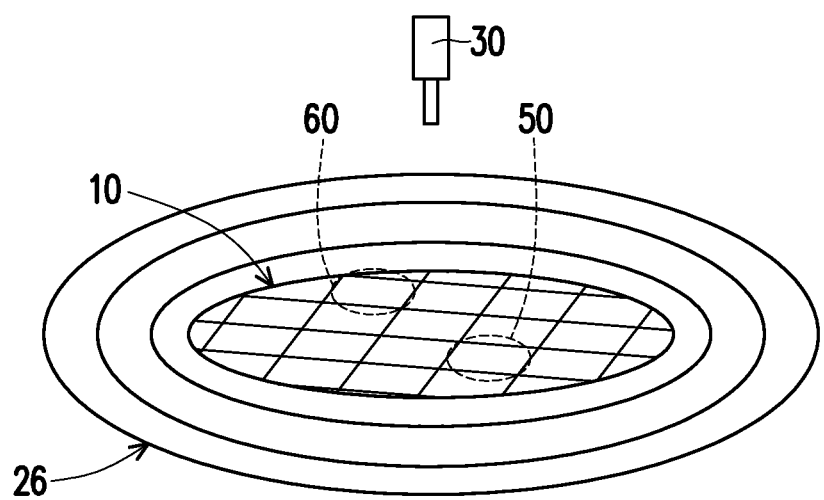

Referring to FIG. 10, a chamfering process is performed on the plurality of IC dies 50 and/or a plurality of dummy dies 60 on the singulated circular wafer 10 with a chamfering tool 30, such as e.g. a laser saw. In some embodiments, the laser saw has a wavelength in a range of about 490 nm to about 570 nm. The laser saw may perform the chamfering with a power in a range of about 10 W to about 20 W and an activation time of about 3 seconds to about 30 seconds. In some embodiments, the chamfering is performed on all four corners of the IC dies 50 and/or the dummy dies 60. In some embodiments, the chamfering is performed on one to three corners of the IC dies 50 and/or the dummy dies 60. The chamfering of the corners and/or edges of the IC dies 50 and/or the dummy dies 60 may allow more room for mechanical braces, such as bolts 202, in the system-on-wafer 1000 (see above, FIG. 1) while maintaining a small spacing between adjacent IC dies 50 and/or dummy dies 60. In some embodiments, the chamfering is performed on the edges of the IC dies 50 and/or the dummy dies 60. In some embodiments, all of the IC dies 50 and/or the dummy dies 60 on the singulated circular wafer 10 are chamfered. In some embodiments, some of the IC dies 50 and/or the dummy dies 60 on the singulated circular wafer 10 are chamfered and some are not chamfered.

Figure 11A:
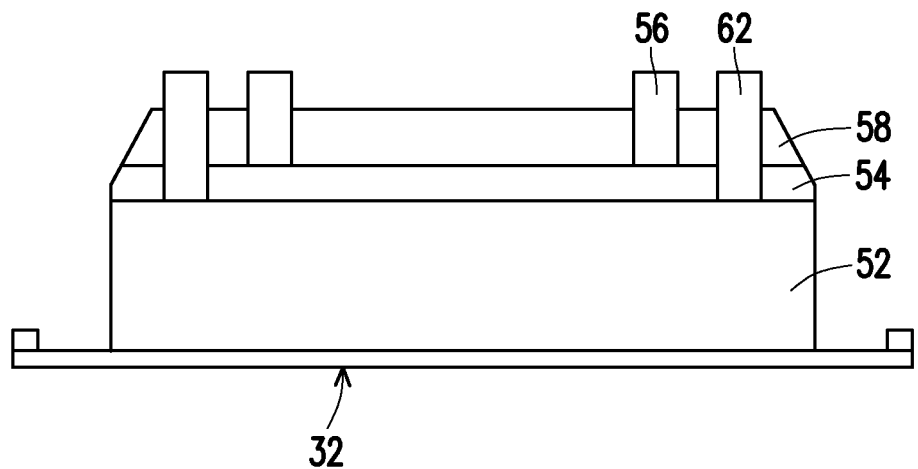
FIG. 11A illustrates a cross-sectional view of a die.
Figure 11B:
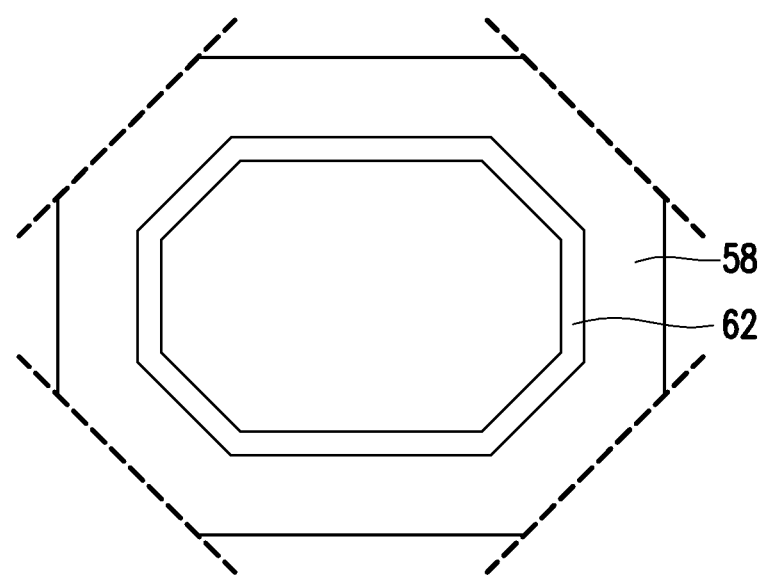
FIGS. 11B through 11D illustrate plan views of dies.
Figure 11C:
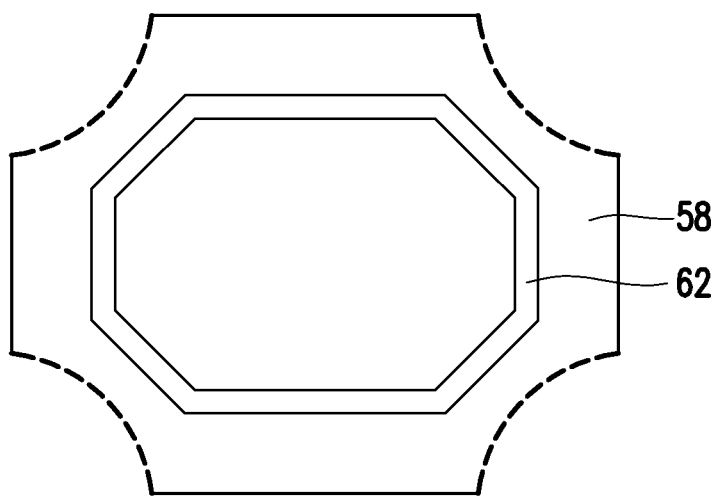
Figure 11D:
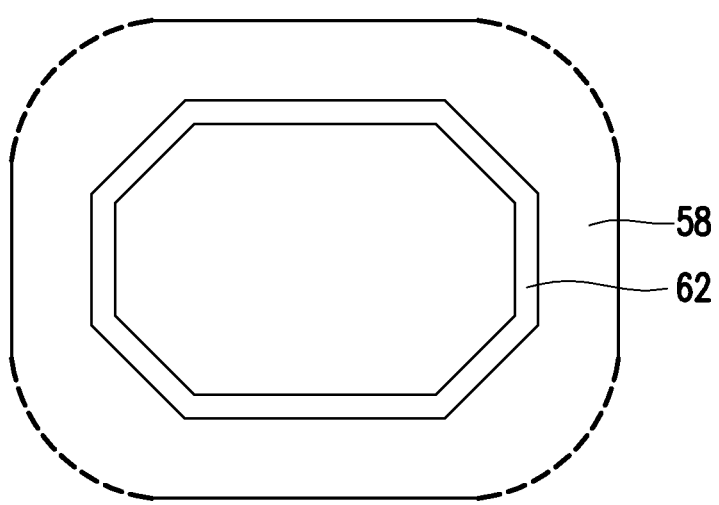

Next, in FIG. 11A, the chamfered IC die 50 is picked up from the singulated circular wafer 10 or singulated rectangular wafer 20 and placed using a suitable pick-and-place tool on a tape 32 in preparation for inclusion in a system-on-wafer 1000 as shown below in FIGS. 12 through 22. Chamfered dummy dies 60 may be moved to the tape 32 by a substantially similar process. FIGS. 11B, 11C, and 11D illustrate plan views of the chamfered IC die 50 as illustrated in FIG. 11A, in accordance with some embodiments. FIG. 11B illustrates an embodiment in which the corners of the chamfered IC die 50 are chamfered with straight line edges. FIG. 11C illustrates an embodiment in which the corners of the chamfered IC die 50 are chamfered with concave edges. FIG. 11D illustrates an embodiment in which the corners of the chamfered IC die 50 are chamfered with convex edges. In some embodiments, the chamfered dummy dies 60 are chamfered with the same patterns as illustrated for the chamfered IC die 50 in FIGS. 11B, 11C, and 11D.

Figure 11E:
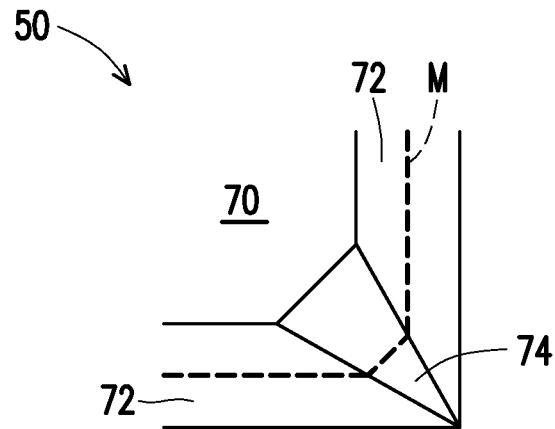
FIGS. 11E through 11G illustrate perspective views of dies, in accordance with some embodiments.
Figure 11F:
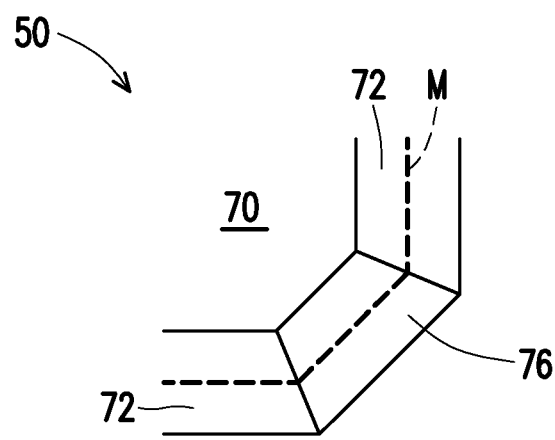
Figure 11G:
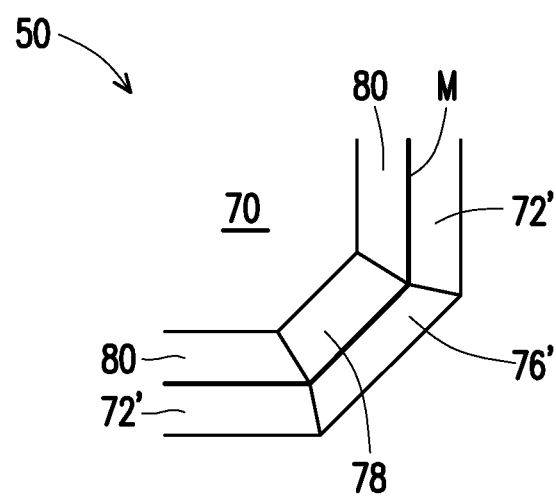

FIGS. 11E through 11G illustrate perspective views of a corner of the chamfered IC die 50 shown above in FIG. 11A, in accordance with some embodiments. In some embodiments, the chamfered dummy dies 60 are chamfered with the same patterns as illustrated for the chamfered IC die 50 in FIGS. 11E through 11G.

Referring to FIG. 11E, a triangular chamfering of the chamfered IC die 50 is illustrated. Triangular chamfered surface 74 is adjacent to top surface 70 on its top edge and is adjacent to sidewalls 72 on its side edges. Dashed line M is illustrated to show the midline of the sidewalls 72. Dashed line M may be above or below the precise midline.

Referring to FIG. 11F, a quadrilateral chamfering of the chamfered IC die 50 is illustrated. Quadrilateral chamfered surface 76 is adjacent to top surface 70 on its top edge and is adjacent to sidewalls 72 on its side edges. In some embodiments, the quadrilateral chamfered surface 76 comprises a rectangular shape with top and bottom edges having substantially the same length. In some embodiments, the quadrilateral chamfered surface 76 comprises a trapezoidal shape with the top edge having a greater length than the bottom edge.

Referring to FIG. 11G, a chamfering of the top edges of the chamfered IC die 50 is illustrated. A quadrilateral chamfering to remove the corner of the IC die 50 has produced lower quadrilateral chamfered surface 76' below the solid line M. Above the solid line M, the top edges of the IC die 50 have been chamfered to produce upper quadrilateral chamfered surface 78 above the lower quadrilateral chamfered surface 76' and chamfered upper sidewalls 80 above lower sidewalls 72'. In some embodiments, a chamfering of the top edges of the IC die 50 is performed in conjunction with a triangular chamfering as illustrated in FIG. 11E.

FIGS. 12 through 22 illustrate cross-sectional views of intermediate steps during a process for forming a system-on-wafer 1000, in accordance with some embodiments. The system-on-wafer 1000 may include a package component 100 such as a super-large fan-out wafer-level package (FOWLP) that comprises a reconstructed wafer having multiple package regions, with one or more of the chamfered IC dies 50 being packaged in each of the package regions. As such, the package component 100 is large. For example, the package component 100 can have a surface area in excess of 10,000 mm$^2$.

Figure 12:
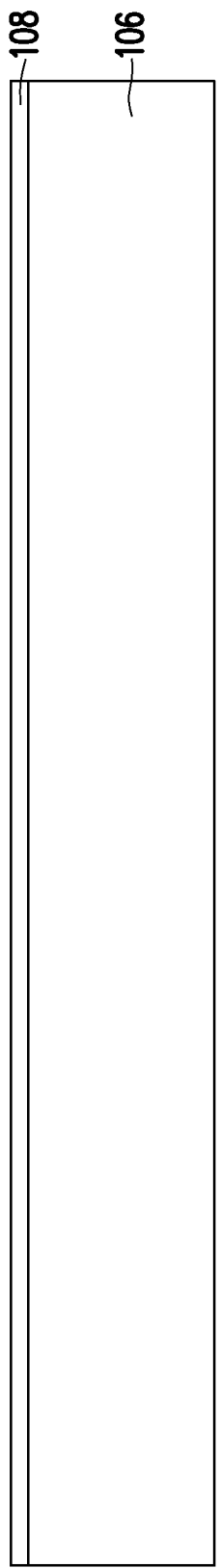
FIGS. 12 through 22 illustrate cross-sectional views of intermediate stages in the construction of a system-on-wafer, in accordance with some embodiments.

In FIG. 12, a carrier substrate 106 is provided, and an adhesive layer 108 is formed on the carrier substrate 106. The carrier substrate 106 may be a glass carrier substrate, a ceramic carrier substrate, or the like. The carrier substrate 106 may be a wafer, such that multiple packages can be formed on the carrier substrate 106 simultaneously. The adhesive layer 108 may be removed along with the carrier substrate 106 from the overlying structures that will be formed in subsequent steps. In some embodiments, the adhesive layer 108 is any suitable adhesive, epoxy, die attach film (DAF), or the like, and is applied over the surface of the carrier substrate 106.

Figure 13:
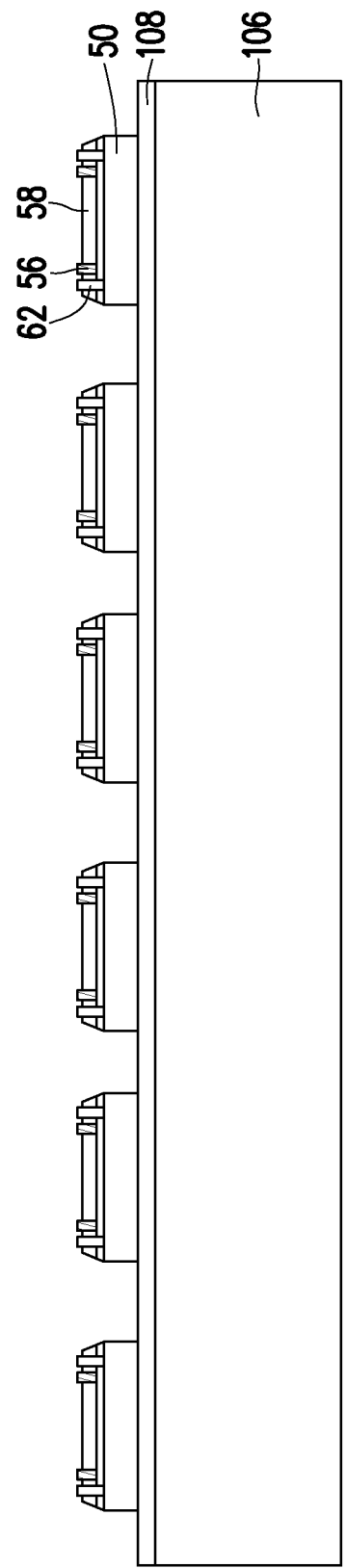

In FIG. 13, chamfered IC dies 50 are attached to the adhesive layer 108. A desired type and quantity of chamfered IC dies 50 are attached. Although chamfered IC dies 50 are illustrated, it should be appreciated that chamfered dummy dies 60 may be attached in place of some of the chamfered IC dies 50. In some embodiments, unchamfered IC dies 50 and/or unchamfered dummy dies 60 are attached in addition to the chamfered IC dies 50 and/or chamfered dummy dies 60.

Figure 14:
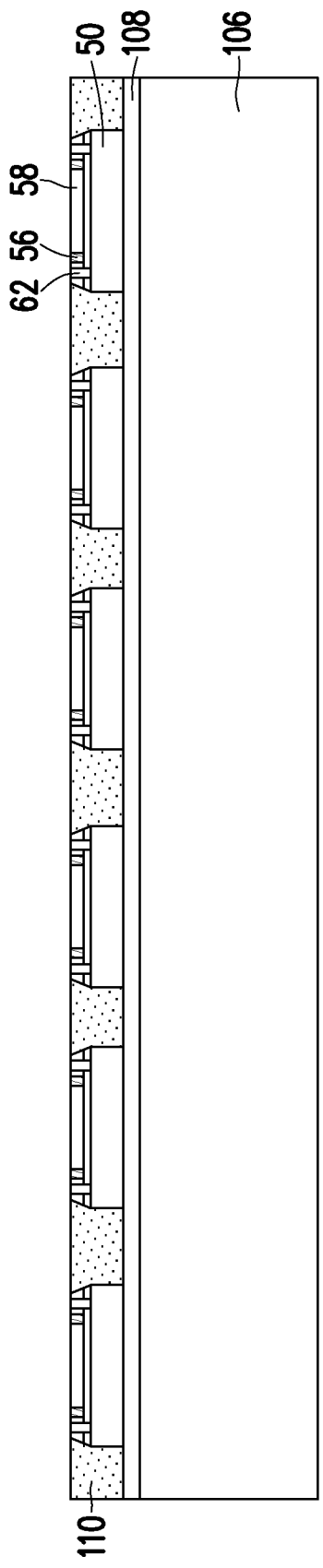

In FIG. 14, an encapsulant 110 is formed on and around the various components. After formation, the encapsulant 110 encapsulates the chamfered IC dies 50. The encapsulant 110 may be a molding compound, epoxy, or the like, and may be applied by compression molding, transfer molding, or the like. The encapsulant 110 may be applied in liquid or semi-liquid form and then subsequently cured. In some embodiments, the encapsulant 110 is formed over the carrier substrate 106 such that the chamfered IC dies 50 are buried or covered, and a planarization process is then performed on the encapsulant 110 to expose the die connectors 56 of the chamfered IC dies 50. Topmost surfaces of the encapsulant 110, seal rings 62, die connectors 56, and dielectric layers 58 are coplanar after the planarization process. The planarization process may be, for example, a chemical-mechanical polish (CMP).

Figure 15:
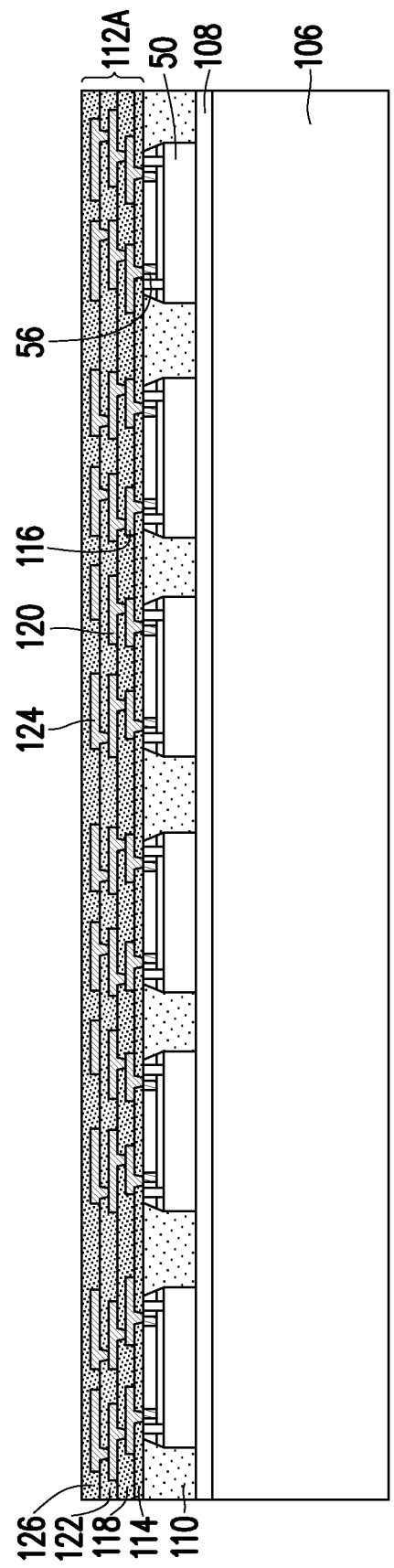
Figure 16:
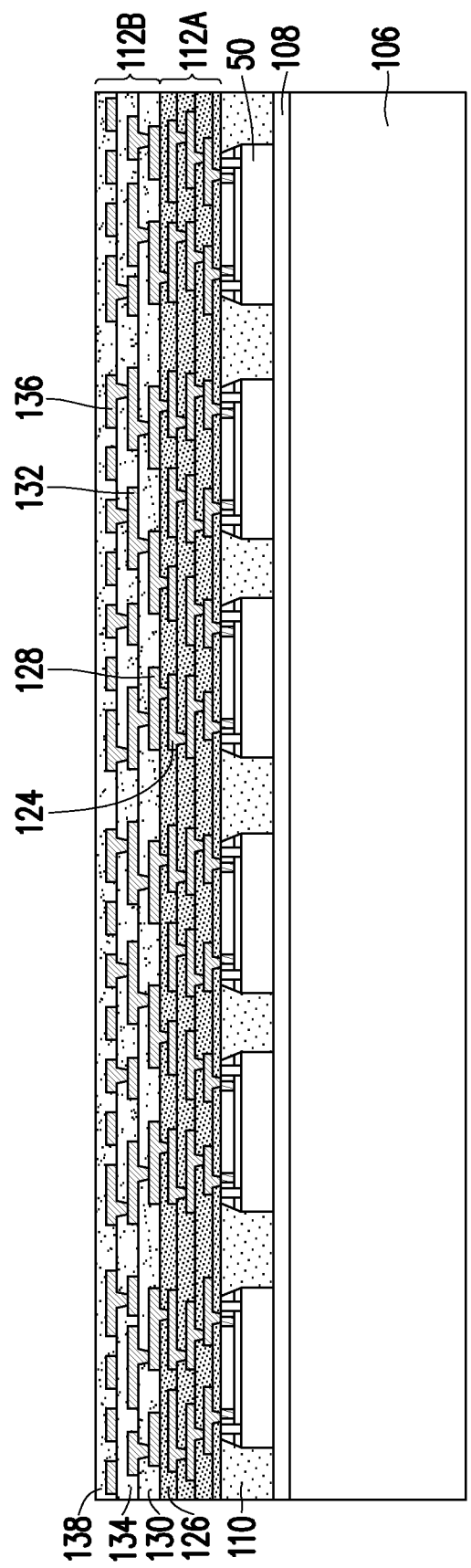
Figure 17:
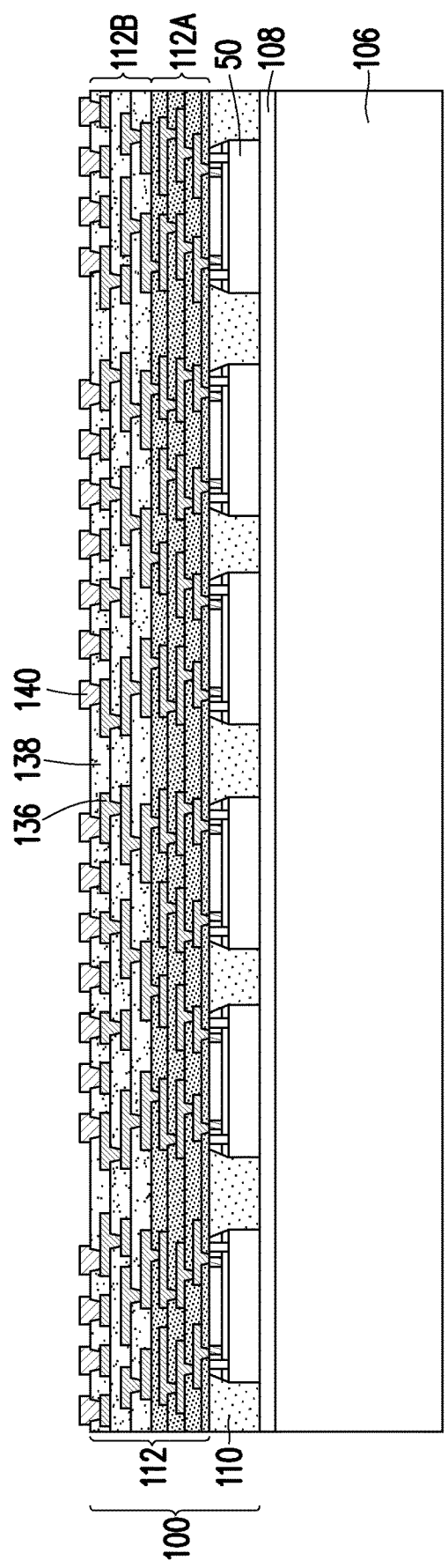

In FIGS. 15 through 17, a redistribution structure 112 (see FIG. 7) having a fine-featured portion 112A and a coarse-featured portion 112B is formed over the encapsulant 110 and chamfered IC dies 50. The seal rings 62 are present but not illustrated. The redistribution structure 112 includes metallization patterns, dielectric layers, and under-bump metallurgies (UBMs). The metallization patterns may also be referred to as redistribution layers or redistribution lines. The redistribution structure 112 is shown as an example having six layers of metallization patterns. More or fewer dielectric layers and metallization patterns may be formed in the redistribution structure 112. If fewer dielectric layers and metallization patterns are to be formed, steps and process discussed below may be omitted. If more dielectric layers and metallization patterns are to be formed, steps and processes discussed below may be repeated. The fine-featured portion 112A and coarse-featured portion 112B of the redistribution structure 112 include metallization patterns and dielectric layers of differing sizes.

In FIG. 15, the fine-featured portion 112A of the redistribution structure 112 is formed. The fine-featured portion 112A of the redistribution structure 112 includes dielectric layers 114, 118, 122, and 126; and metallization patterns 116, 120, and 124. In some embodiments, the dielectric layers 118, 122 and 126 are formed from a same dielectric material, and are formed to a same thickness. Likewise, in some embodiments, the conductive features of the metallization patterns 116, 120 and 124 are formed from a same conductive material, and are formed to a same thickness.

As an example of forming the fine-featured portion 112A of the redistribution structure 112, the dielectric layer 114 is deposited on the encapsulant 110, dielectric layers 58, and die connectors 56. In some embodiments, the dielectric layer 114 is formed of a photo-sensitive material such as PBO, polyimide, BCB, or the like, which may be patterned using a lithography mask. The dielectric layer 114 may be formed by spin coating, lamination, CVD, the like, or a combination thereof. The dielectric layer 114 is then patterned. The patterning forms openings exposing portions of the die connectors 56. The patterning may be by an acceptable process, such as by exposing the dielectric layer 114 to light when the dielectric layer 114 is a photo-sensitive material or by etching using, for example, an anisotropic etch. If the dielectric layer 114 is a photo-sensitive material, the dielectric layer 114 can be developed after the exposure.

The metallization pattern 116 is then formed. The metallization pattern 116 has line portions (also referred to as conductive lines or traces) on and extending along the major surface of the dielectric layer 114, and has via portions (also referred to as conductive vias) extending through the dielectric layer 114 to physically and electrically couple the die connectors 56 of the chamfered IC dies 50. As an example to form the metallization pattern 116, a seed layer is formed over the dielectric layer 114 and in the openings extending through the dielectric layer 114. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 116. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 116. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layer 118 is then deposited on the metallization pattern 116 and dielectric layer 114. The dielectric layer 118 may be formed in a similar manner and of a similar material as the dielectric layer 114. The metallization pattern 120 is then formed. The metallization pattern 120 has line portions on and extending along the major surface of the dielectric layer 118, and has via portions extending through the dielectric layer 118 to physically and electrically couple the metallization pattern 116. The metallization pattern 120 may be formed in a similar manner and of a similar material as the metallization pattern 116.

The dielectric layer 122 is then deposited on the metallization pattern 120 and dielectric layer 118. The dielectric layer 122 may be formed in a similar manner and of a similar material as the dielectric layer 114. The metallization pattern 124 is then formed. The metallization pattern 124 has line portions on and extending along the major surface of the dielectric layer 122, and has via portions extending through the dielectric layer 122 to physically and electrically couple the metallization pattern 120. The metallization pattern 124 may be formed in a similar manner and of a similar material as the metallization pattern 116.

The dielectric layer 126 is deposited on the metallization pattern 124 and dielectric layer 122. The dielectric layer 126 may be formed in a similar manner and of a similar material as the dielectric layer 114.

In FIG. 16, the coarse-featured portion 112B of the redistribution structure 112 is formed. The coarse-featured portion 112B of the redistribution structure 112 includes dielectric layers 130, 134, and 138; and metallization patterns 128, 132, and 136. In some embodiments, the dielectric layers 130, 134, and 138 are formed from a same dielectric material, and are formed to a same thickness. Likewise, in some embodiments, the conductive features of the metallization patterns 128, 132, and 136 are formed from a same conductive material, and are formed to a same thickness. In particular, the dielectric layers 130, 134, and 138 have a greater thickness than the dielectric layers 114, 118, 122, and 126, and the metallization patterns 128, 132, and 136 have a greater thickness than the metallization patterns 166, 120, and 124.

As an example of forming the coarse-featured portion 112B of the redistribution structure 112, the metallization pattern 128 is formed. The metallization pattern 128 has line portions on and extending along the major surface of the dielectric layer 126, and has via portions extending through the dielectric layer 126 to physically and electrically couple the metallization pattern 124. As an example to form the metallization pattern 128, a seed layer is formed over the dielectric layer 126 and in the openings extending through the dielectric layer 126. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 128. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 128. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layer 130 is then deposited on the metallization pattern 128 and dielectric layer 126. In some embodiments, the dielectric layer 130 is formed of a photosensitive material such as PBO, polyimide, BCB, or the like, which may be patterned using a lithography mask. The dielectric layer 130 may be formed by spin coating, lamination, CVD, the like, or a combination thereof. The metallization pattern 132 is then formed. The metallization pattern 132 has line portions on and extending along the major surface of the dielectric layer 130, and has via portions extending through the dielectric layer 130 to physically and electrically couple the metallization pattern 128. The metallization pattern 132 may be formed in a similar manner and of a similar material as the metallization pattern 128.

The dielectric layer 134 is then deposited on the metallization pattern 132 and dielectric layer 130. The dielectric layer 134 may be formed in a similar manner and of a similar material as the dielectric layer 130. The metallization pattern 136 is then formed. The metallization pattern 136 has line portions on and extending along the major surface of the dielectric layer 134, and has via portions extending through the dielectric layer 134 to physically and electrically couple the metallization pattern 132. The metallization pattern 136 may be formed in a similar manner and of a similar material as the metallization pattern 128.

The dielectric layer 138 is deposited on the metallization pattern 136 and dielectric layer 134. The dielectric layer 138 may be formed in a similar manner and of a similar material as the dielectric layer 130.

In FIG. 17, UBMs 140 are formed for external connection to the redistribution structure 112. The UBMs 140 have bump portions on and extending along the major surface of the dielectric layer 138, and have via portions extending through the dielectric layer 138 to physically and electrically couple the metallization pattern 136. As a result, the UBMs 140 are electrically coupled to the chamfered IC dies 50. The UBMs 140 may be formed in a similar manner and of a similar material as the metallization pattern 136. In some embodiments, the UBMs 140 have a different size than the metallization patterns 116, 120, 124, 128, 132, and 136.

Figure 18:
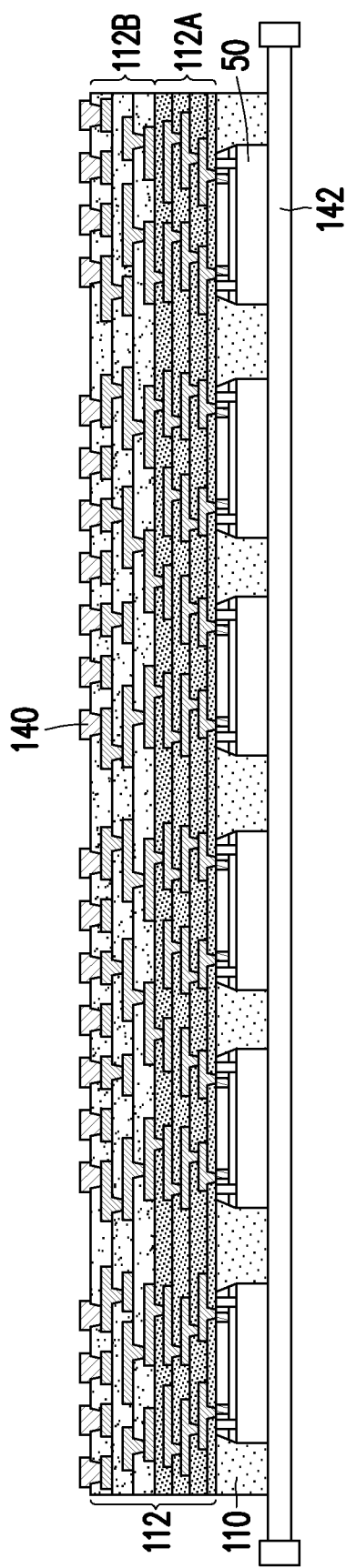

In FIG. 18, a carrier substrate debonding is performed to detach (or "debond") the carrier substrate 106 from the encapsulant 110 and chamfered IC dies 50. In some embodiments, the debonding includes removing the carrier substrate 106 and adhesive layer 108 by, e.g., a grinding or planarization process, such as a CMP. After removal, back side surfaces of the chamfered IC dies 50 are exposed, and the back side surfaces of the encapsulant 110 and chamfered IC dies 50 are level. The structure is then placed on a tape 142.

Figure 19:
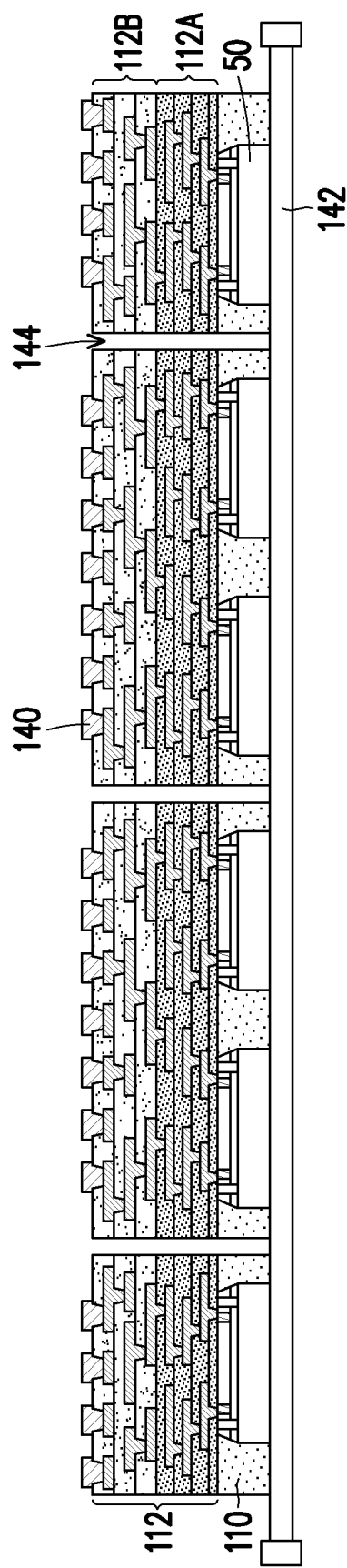

In FIG. 19, bolt holes 144 are formed through the package component 100. The bolt holes 144 may be formed by a drilling process such as laser drilling, mechanical drilling, or the like. The bolt holes 144 may be formed by drilling an outline for the bolt holes 144 with the drilling process, and then removing the material separated by the outline.

Figure 20:
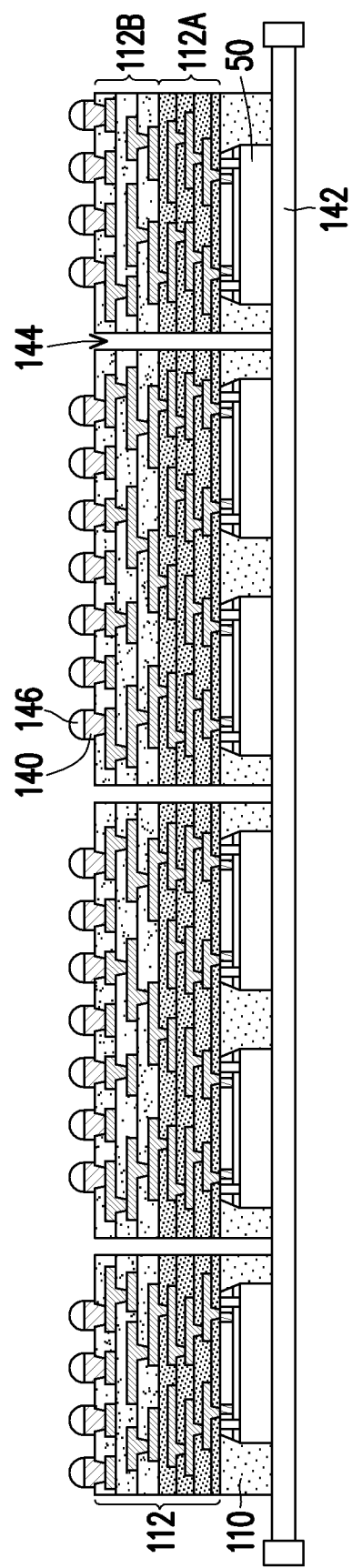

In FIG. 20, conductive connectors 146 are formed on the UBMs 140. The conductive connectors 146 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 146 may include a conductive material such as solder, copper, aluminum, gold, nickel, silver, palladium, tin, the like, or a combination thereof. In some embodiments, the conductive connectors 146 are formed by initially forming a layer of solder or solder paste through evaporation, electroplating, printing, solder transfer, ball placement, or the like. Once a layer of solder has been formed on the structure, a reflow may be performed in order to shape the material into the desired bump shapes.

Figure 21:
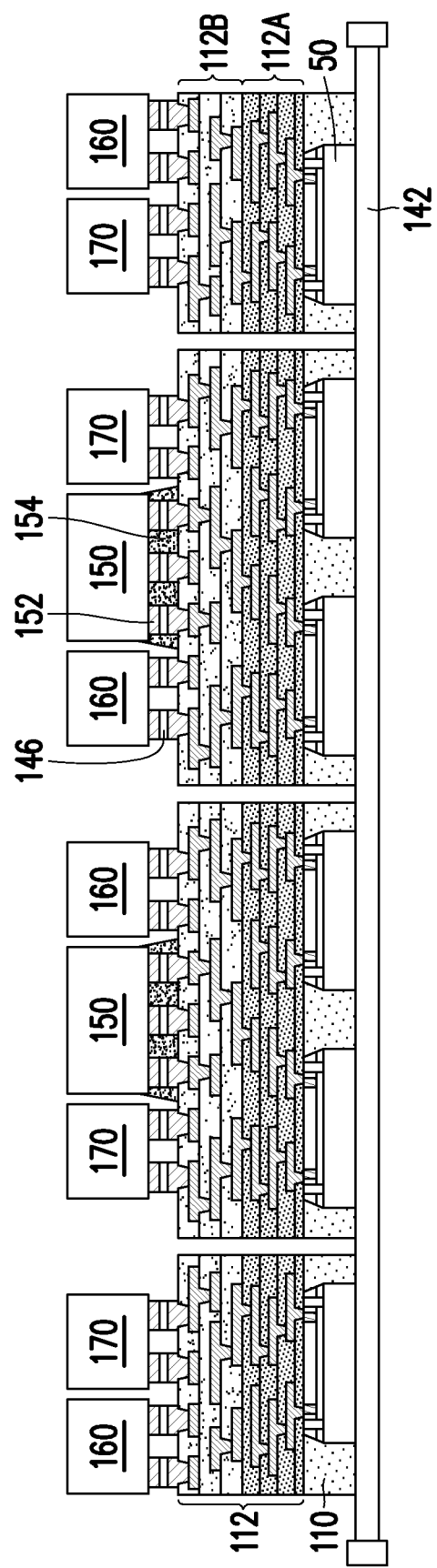

In FIG. 21, other packages 150, passive devices 160, and/or connectors 170 are attached to the redistribution structure 112. The other packages 150 may be, e.g., silicon function dies. The passive devices 160 may be Integrated Passive Devices (IPDs). The connectors 170 are interfaces for external connection to the system-on-wafer 1000 (discussed further below, see FIG. 22). The other packages 150, passive devices 160, and/or connectors 170 include pads 152, such as aluminum pads, which are used for physical and electrical connection to the redistribution structure 112. Attaching the other packages 150, passive devices 160, and/or connectors 170 may include placing the other packages 150, passive devices 160, and/or connectors 170 on the redistribution structure 112 using, e.g., a pick-and-place technique, and then reflowing the conductive connectors 146 to physically and electrically couple the pads 152 to the UBMs 140. Reflow of the conductive connectors 146 may be performed such that the other packages 150, passive devices 160, and/or connectors 170 are simultaneously attached to the redistribution structure 112. An underfill 154 may be formed to fill the gaps between the other packages 150 and the redistribution structure 112. The underfill 154 may be formed by a capillary flow process after the other packages 150 are attached, or may be formed by a suitable deposition method before the other packages 150, passive devices 160, and/or connectors 170 are attached.

Figure 22:
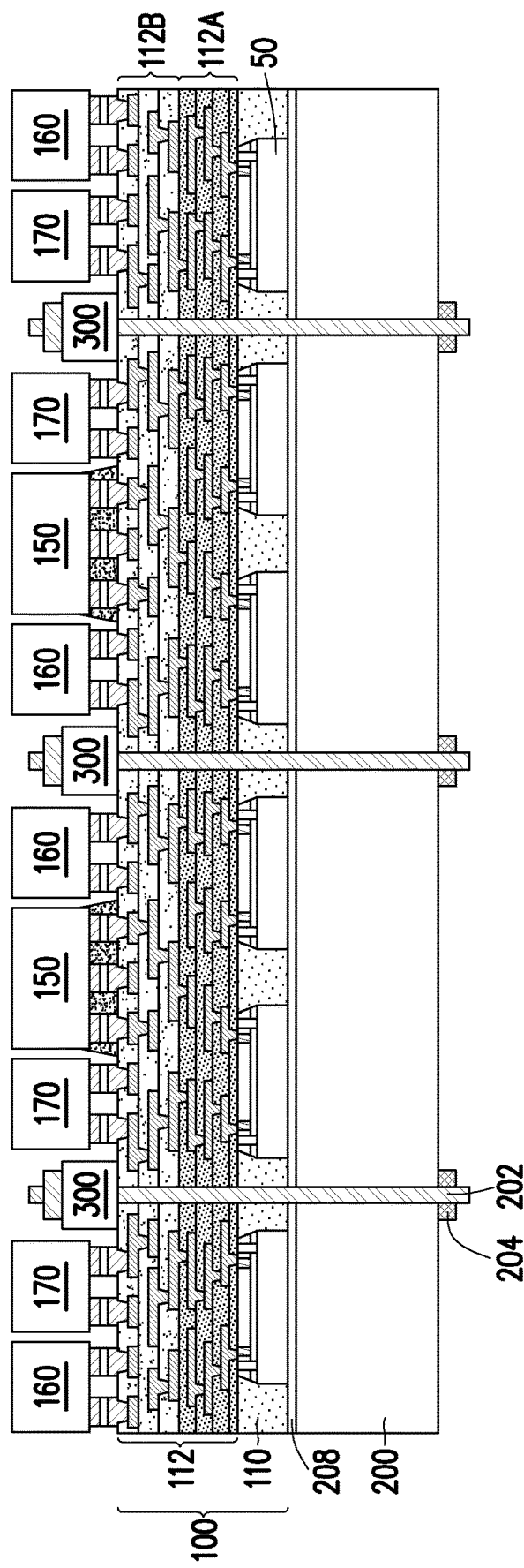

FIG. 22 illustrates a cross-sectional view of a system-on-wafer or system-on-wafer assembly 1000, in accordance with some embodiments. The system-on-wafer assembly 1000 is formed by securing the package component 100 between a thermal module 200 and a mechanical brace 300. The thermal module 200 may be a heat sink, a heat spreader, a cold plate, or the like. The mechanical brace 300 is a rigid support that may be formed from a material with a high stiffness, such as a metal, e.g., steel, titanium, cobalt, or the like. The mechanical brace 300 physically engages portions of the redistribution structure 112. Warpage of the package component 100, such as that induced by carrier substrate debonding, may be reduced by clamping the package component 100 between the thermal module 200 and mechanical brace 300. The mechanical brace 300 is a grid that has openings exposing portions of the module sockets 148, for ease of module installation.

The package component 100 is removed from the tape 142 and is fastened between the thermal module 200 and mechanical brace 300 with bolts 202. The bolts 202 are threaded through the bolt holes 144 of the package component 100, through corresponding bolt holes in the thermal module 200, and through corresponding bolt holes in the mechanical brace 300. Fasteners 204 are threaded onto the bolts 202 and tightened to clamp the package component 100 between the thermal module 200 and mechanical brace 300. The fasteners 204 may be, e.g., nuts that thread to the bolts 202. The fasteners 204 attach to the bolts 202 at both sides of the system-on-wafer assembly 1000 (e.g., at the side having the thermal module 200 (sometimes referred to as the back side) and at the side having the mechanical brace 300

(sometimes referred to as the front side)). After being attached, portions of the mechanical brace 300 are disposed between devices attached to the top side of the package component 100, such as connectors 170, packages 150, and/or passive devices 160.

Before fastening together the various components, a thermal interface material (TIM) 208 may be dispensed on the back side of the package component 100, physically and thermally coupling the thermal module 200 to the integrated circuit dies 50. In some embodiments, the TIM 206 is formed of a film comprising indium and a HM03 type material. During fastening, the fasteners 204 are tightened, thereby increasing the mechanical force applied to the package component 100 by the thermal module 200 and the mechanical brace 300. The fasteners 204 are tightened until the thermal module 200 exerts a desired amount of pressure on the TIM 206.

Embodiments disclosed above, including a package and method of forming a package integrating a thermal module while reducing the die to die spacing in the package, may provide advantages. Denser die placement while still allowing for mechanical braces (e.g., screws) that attach the thermal modules to the package may be achieved by the dies in the package having chamfered edges or corners. The embodiments disclosed above may be applied to, e.g., a super-large package with an area more than 10000 mm$^2$ based on fan-out wafer-level package process. Electrical performance of the package may be further improved by the embodiments discussed above. The disclosed embodiments may provide further advantages such as reducing chip to chip space by Si chamfering process for fine pitch Si-interconnect, improving routing feasibility by including six or more layers of redistribution layers, and enabling a chiplet design approach that separates many functions performed by a larger chip into fewer functions performed by smaller chips.

In accordance with an embodiment, a semiconductor device includes: a first die, the first die including a chamfered corner; an encapsulant over a front-side surface of the first die, the encapsulant at least partially surrounding the first die; a redistribution structure on the encapsulant; a thermal interface material on the back-side surface of the first die; a thermal module thermally and physically coupled to the back-side surface of the first die with the thermal interface material; and a bolt extending through the redistribution structure and the thermal module, the bolt being adjacent to the chamfered corner. In an embodiment, the first die is an integrated circuit die. In an embodiment, the first die is a dummy die. In an embodiment, the first die includes four chamfered corners. In an embodiment, the first die has only one chamfered corner. In an embodiment, the chamfered corner includes a straight line shape. In an embodiment, the chamfered corner includes a concave shape. In an embodiment, the chamfered corner includes a convex shape. In an embodiment, the chamfered corner includes an inverted corner.

In accordance with another embodiment, a packaged semiconductor device includes: a first chamfered corner on a first die; a second chamfered corner on a second die; a third chamfered corner on a third die; a fourth chamfered corner on a fourth die; a redistribution structure over the first die, the second die, the third die, and the fourth die; a thermal module thermally and physically coupled to the first die, the second die, the third die, and the fourth die, the thermal module being opposite the redistribution structure; and a bolt extending through the redistribution structure, the bolt being surrounded by the first, second, third, and fourth chamfered corners, the bolt further extending through the thermal module. In an embodiment, the first die has a first length measured between opposite sidewalls, the first chamfered corner has a second length measured between the outer vertex of the first chamfered corner to a vertex of the first chamfered corner on a remaining sidewall of the first die, and the ratio of the second length to the first length is in a range of 0.01 to 0.3. In an embodiment, the first chamfered corner has a first surface area measured between the outer vertex of the first chamfered corner and vertices of the first chamfered corner on remaining sidewalls of the first die, the first die has an original surface area measured on the top surface of the first die before chamfering, and the ratio of the first surface area to the original surface area is in a range of 0.01 to 0.3. In an embodiment, an angle θ between a bottom of the first die and the chamfered face of the first chamfered corner is in a range of 30° to 90°.

In accordance with yet another embodiment, a method of manufacturing a semiconductor device includes: chamfering a first corner of a first die, wherein an edge of the chamfered first corner is parallel to a portion of a seal ring on the first die; encapsulating the first die with an encapsulant; forming a redistribution structure over the encapsulant, wherein forming the redistribution structure includes forming layers of metallization patterns and dielectric layers therebetween; forming a hole through the redistribution structure and the encapsulant, the hole being adjacent the chamfered first corner; and attaching a thermal module to the redistribution structure with a bolt, the thermal module being on a back side of the first die opposite the redistribution structure, the bolt extending through the hole. In an embodiment, chamfering the first corner of the first die includes using a laser saw. In an embodiment, chamfering the first corner of the first die includes forming a triangular chamfered surface. In an embodiment, chamfering the first corner of the first die includes forming a rectangular chamfered surface. In an embodiment, chamfering the first corner of the first die includes forming a trapezoidal chamfered surface. In an embodiment, the method further includes chamfering the top edges of the first die. In an embodiment, the method further includes chamfering a second corner, a third corner, and a fourth corner of the first die.

In accordance with yet another embodiment, a method of manufacturing a semiconductor device includes: forming a seal ring on a die; chamfering a corner of the die, wherein a straight line edge of the chamfered corner is parallel to a portion of the seal ring; applying an encapsulant around the die; and forming a redistribution structure on the die and the encapsulant. In an embodiment, the method further includes inserting a bolt through the redistribution structure and the encapsulant, wherein the bolt is adjacent to the chamfered corner of the die. In an embodiment, chamfering the corner of the die is performed using a laser saw. In an embodiment, the laser saw has a wavelength in a range of 490 nm to 570 nm. In an embodiment, the laser saw performs the chamfering of the corner with a power in a range of 10 W to 20 W. In an embodiment, the laser saw performs the chamfering of the corner with an activation time in a range of 3 seconds to 30 seconds. In an embodiment, an angle θ between a bottom of the die and a chamfered face of the chamfered corner of the die is in a range of 30° to 90°.

In accordance with yet another embodiment, a method of manufacturing a semiconductor device includes: chamfering a first corner of a first die, a second corner of a second die, a third corner of a third die, and a fourth corner of a fourth die; encapsulating the first die, the second die, the third die, and the fourth die with an encapsulant, wherein the chamfered first corner, the chamfered second corner, the chamfered third corner, and the chamfered fourth corner form a diamond shape in a top view, the encapsulant filling the diamond shape; forming a redistribution structure on the encapsulant, the first die, the second die, the third die, and the fourth die; forming a hole through the redistribution structure and the diamond shape filled by the encapsulant; and inserting a bolt through the hole, wherein the bolt overlaps a first space filled by the first corner of the first die prior to the chamfering of the first corner. In an embodiment, the chamfered first corner includes a straight line shape in a top view. In an embodiment, the chamfered first corner includes a concave shape in a top view. In an embodiment, the chamfered first corner includes a convex shape in a top view. In an embodiment, the chamfered first corner includes an inverted corner in a top view. In an embodiment, the bolt further overlaps a second space filled by the second corner of the second die prior to the chamfering of the second corner.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a seal ring on a die;
    chamfering a corner of the die, wherein a straight line edge of the chamfered corner is parallel to a portion of the seal ring in a top view, and wherein the die has a shape of an octagon in the top view;
    applying an encapsulant around the die; and
    forming a redistribution structure on the die and the encapsulant.

2. The method of claim 1, further comprising inserting a bolt through the redistribution structure and the encapsulant, wherein the bolt is adjacent to the chamfered corner of the die.

3. The method of claim 1, wherein chamfering the corner of the die is performed using a laser saw.

4. The method of claim 3, wherein the laser saw has a wavelength in a range of 490 nm to 570 nm.

5. The method of claim 3, wherein the laser saw performs the chamfering of the corner with a power in a range of 10 W to 20 W.

6. The method of claim 3, wherein the laser saw performs the chamfering of the corner with an activation time in a range of 3 seconds to $3o$ seconds.

7. The method of claim 1, wherein an angle θ between a bottom of the die and a chamfered face of the chamfered corner of the die is in a range of 30° to 90°.

8. A method of manufacturing a semiconductor device, the method comprising:
    chamfering a first corner of a first die, wherein the first die comprises a seal ring, and wherein an edge of the chamfered first corner is parallel to a portion of the seal ring;
    encapsulating the first die with an encapsulant;
    forming a redistribution structure over the encapsulant, wherein forming the redistribution structure comprises forming layers of metallization patterns and dielectric layers therebetween;
    forming a hole through the redistribution structure and the encapsulant, the hole being adjacent the chamfered first corner; and
    attaching a thermal module to the redistribution structure with a bolt, the thermal module being on a back side of the first die opposite the redistribution structure, the bolt extending through the hole.

9. The method of claim 8, wherein chamfering the first corner of the first die comprises using a laser saw.

10. The method of claim 8, wherein chamfering the first corner of the first die comprises forming a triangular chamfered surface.

11. The method of claim 8, wherein chamfering the first corner of the first die comprises forming a rectangular chamfered surface.

12. The method of claim 8, wherein chamfering the first corner of the first die comprises forming a trapezoidal chamfered surface.

13. The method of claim 8, further comprising chamfering the top edges of the first die.

14. The method of claim 8, further comprising chamfering a second corner, a third corner, and a fourth corner of the first die.

15. A method of manufacturing a semiconductor device, the method comprising:
    chamfering a first corner of a first die, a second corner of a second die, a third corner of a third die, and a fourth corner of a fourth die;
    encapsulating the first die, the second die, the third die, and the fourth die with an encapsulant, wherein the chamfered first corner, the chamfered second corner, the chamfered third corner, and the chamfered fourth corner form a diamond shape in a top view, the encapsulant filling the diamond shape;
    forming a redistribution structure on the encapsulant, the first die, the second die, the third die, and the fourth die;
    forming a hole through the redistribution structure and the diamond shape filled by the encapsulant; and
    inserting a bolt through the hole, wherein the bolt overlaps a first space filled by the first corner of the first die prior to the chamfering of the first corner.

16. The method of claim 15, wherein the chamfered first corner comprises a straight line shape in a top view.

17. The method of claim 15, wherein the chamfered first corner comprises a concave shape in a top view.

18. The method of claim 15, wherein the chamfered first corner comprises a convex shape in a top view.

19. The method of claim 15, wherein the chamfered first corner comprises an inverted corner in a top view.

20. The method of claim 15, wherein the bolt further overlaps a second space filled by the second corner of the second die prior to the chamfering of the second corner.

* * * * *

UNITED STATES PATENT AND TRADEMARK OFFICE
CERTIFICATE OF CORRECTION

PATENT NO. : 11,854,986 B2
APPLICATION NO. : 17/809961
DATED : December 26, 2023
INVENTOR(S) : Yu et al.

Page 1 of 1

It is certified that error appears in the above-identified patent and that said Letters Patent is hereby corrected as shown below:

In the Claims

In Column 15, in Claim 6, Line 57, delete "3o" and insert -- 30 --.

Signed and Sealed this
Ninth Day of April, 2024

Katherine Kelly Vidal
*Director of the United States Patent and Trademark Office*